(12) United States Patent
Chen et al.

(10) Patent No.: US 12,364,105 B2
(45) Date of Patent: *Jul. 15, 2025

(54) DISPLAY DEVICE

(71) Applicant: Red Oak Innovations Limited, Dublin (IE)

(72) Inventors: Lien-Hsiang Chen, Miao-Li County (TW); Kung-Chen Kuo, Miao-Li County (TW); Sheng-Kai Hsu, Miao-Li County (TW); Hsia-Ching Chu, Miao-Li County (TW); Mei-Chun Shih, Miao-Li County (TW)

(73) Assignee: Red Oak Innovations Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 19/030,244

(22) Filed: Jan. 17, 2025

(65) Prior Publication Data

US 2025/0169294 A1    May 22, 2025

Related U.S. Application Data

(63) Continuation of application No. 18/659,476, filed on May 9, 2024, which is a continuation of application (Continued)

(30) Foreign Application Priority Data

Sep. 8, 2016    (CN) .......................... 201610809206.8

(51) Int. Cl.
*H10K 59/124*    (2023.01)
*H10D 30/67*    (2025.01)
(Continued)

(52) U.S. Cl.
CPC ....... *H10K 59/124* (2023.02); *H10D 30/6739* (2025.01); *H10K 50/80* (2023.02);
(Continued)

(58) Field of Classification Search
None
See application file for complete search history.

(56) References Cited

U.S. PATENT DOCUMENTS

| | | |
|---|---|---|
| 5,999,157 A | 12/1999 | Ito et al. |
| 6,111,621 A | 8/2000 | Kim et al. |

(Continued)

FOREIGN PATENT DOCUMENTS

| | | | | |
|---|---|---|---|---|
| CN | 112420787 A | * | 2/2021 | ......... G06V 40/1318 |
| JP | 2016039070 A | | 3/2016 | |

(Continued)

OTHER PUBLICATIONS

OLED Panel Analysis of Samsung Galaxy S6, 12 pages, report completed Feb. 1, 2022, product released in 2015.

*Primary Examiner* — Michael Lebentritt
(74) *Attorney, Agent, or Firm* — Studebaker Brackett PLLC

(57) ABSTRACT

A display device includes: a substrate; a first transistor and a second transistor disposed on the substrate; a first electrode and a second electrode, wherein the first electrode is electrically connected to the first transistor through a first via hole, and the second electrode is electrically connected to the second transistor through a second via hole; a first signal line disposed on the substrate and overlapped with the first electrode and the second electrode; and a second signal line disposed on the substrate and adjacent to the first signal line, wherein the first signal line and the second signal line extend along a first direction, wherein a distance between the first via hole and the second via hole along the first direction is (Continued)

greater than a distance between the first signal line and the second signal line along a second direction different the first direction.

11 Claims, 7 Drawing Sheets

Related U.S. Application Data

No. 18/209,537, filed on Jun. 14, 2023, now Pat. No. 12,010,881, which is a continuation of application No. 17/719,310, filed on Apr. 12, 2022, now Pat. No. 11,723,239, which is a continuation of application No. 16/995,867, filed on Aug. 18, 2020, now Pat. No. 11,335,751, which is a continuation of application No. 16/264,761, filed on Feb. 1, 2019, now Pat. No. 10,790,343, which is a continuation of application No. 15/695,051, filed on Sep. 5, 2017, now Pat. No. 10,236,329.

(51) Int. Cl.
*H10K 50/80* (2023.01)
*H10K 59/121* (2023.01)
*H10K 59/122* (2023.01)
*H10K 59/123* (2023.01)
*H10K 71/00* (2023.01)

(52) U.S. Cl.
CPC ......... *H10K 59/121* (2023.02); *H10K 59/122* (2023.02); *H10K 59/123* (2023.02); *H10K 71/00* (2023.02)

(56) References Cited

U.S. PATENT DOCUMENTS

| | | | |
|---|---|---|---|
| 10,790,343 | B2 | 9/2020 | Chen et al. |
| 11,335,751 | B2 | 5/2022 | Chen et al. |
| 11,646,303 | B2 * | 5/2023 | Kang ................ H01L 25/18 |
| | | | 345/204 |
| 11,723,239 | B2 | 8/2023 | Chen et al. |
| 2009/0061721 | A1 | 3/2009 | Isa |
| 2011/0085100 | A1 | 4/2011 | Kim et al. |
| 2011/0141376 | A1 | 6/2011 | Tsubata |
| 2013/0293820 | A1 | 11/2013 | Lee |
| 2014/0292622 | A1 | 10/2014 | Lee |
| 2015/0070644 | A1 | 3/2015 | Lee et al. |
| 2016/0091654 | A1 | 3/2016 | Kim |
| 2016/0187746 | A1 | 6/2016 | Yue et al. |
| 2016/0190178 | A1 | 6/2016 | Ding et al. |
| 2017/0162111 | A1 | 6/2017 | Kang et al. |
| 2017/0256738 | A1 | 9/2017 | Chen et al. |
| 2018/0069065 | A1 | 3/2018 | Chen et al. |
| 2019/0165070 | A1 | 5/2019 | Chen et al. |
| 2020/0105849 | A1 | 4/2020 | Kim et al. |
| 2020/0381500 | A1 | 12/2020 | Chen et al. |
| 2022/0238617 | A1 | 7/2022 | Chen et al. |
| 2023/0296224 | A1 * | 9/2023 | Tsai ................ H10K 59/879 |
| | | | 362/84 |
| 2023/0329045 | A1 | 10/2023 | Chen et al. |

FOREIGN PATENT DOCUMENTS

| | | | |
|---|---|---|---|
| KR | 20120136651 | A | 12/2012 |
| KR | 20140035239 | A | 3/2014 |
| KR | 20140118010 | A | 10/2014 |
| WO | WO-2023108820 | A1 * | 6/2023 |

* cited by examiner

DISPLAY DEVICE

CROSS REFERENCE TO RELATED APPLICATION

This application claims the benefits of the Chinese Patent Application No. 201610809206.8, filed on Sep. 8, 2016, the subject matter of which is incorporated herein by reference.

This application is a continuation (CA) of U.S. Patent application for "Display device", U.S. application Ser. No. 18/659,476 filed May 9, 2024; U.S. application Ser. No. 18/659,476 is a continuation (CA) of U.S. application Ser. No. 18/209,537 filed Jun. 14, 2023; U.S. application Ser. No. 18/209,537 is a continuation (CA) of U.S. application Ser. No. 17/719,310 filed Apr. 12, 2022; U.S. application Ser. No. 17/719,310 is a continuation (CA) of U.S. application Ser. No. 16/995,867 filed Aug. 18, 2020; U.S. application Ser. No. 16/995,867 is a continuation (CA) of U.S. application Ser. No. 16/264,761 filed Feb. 1, 2019; U.S. application Ser. No. 16/264,761 is a continuation (CA) of U.S. application Ser. No. 15/695,051 filed Sep. 5, 2017; and the subject matters of which are incorporated herein by reference.

BACKGROUND

1. Field

The present disclosure relates to a display device and, more particularly, to a display device with improved manufacture yield.

2. Description of Related Art

With the continuous advancement of technologies related to displays, all the display devices are now developed toward compactness, thinness, and lightness. This trend makes thin displays, such as liquid crystal display devices, organic light-emitting diode display devices and inorganic light-emitting diode display devices, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

The organic light-emitting diode (OLED) display devices has advantages of: light weight, thin thickness, high brightness, fast response, large viewing angle, no need for backlight, low manufacturing cost and flexibility, and is considered as a next-generation display device.

During the manufacturing process of the OLED display device, light emitting layers capable of emitting different colors are formed by vapor depositions. However, if pixel units with different colors are too close, the mask used for vapor depositions has to be finer, and color mix of adjacent pixel units with different colors may be occurred.

Therefore, it is desirable to provide an OLED display device, wherein the design of the pixel units is modified to improve the manufacture yield of the OLED display device.

SUMMARY

The present disclosure provides a display device, comprising: a substrate; a first transistor and a second transistor disposed on the substrate; an insulating layer disposed on the first transistor and the second transistor; a first electrode and a second electrode disposed on the insulating layer, wherein the first electrode is electrically connected to the first transistor through a first via hole passing through the insulating layer, and the second electrode is electrically connected to the second transistor through a second via hole passing through the insulating layer; a first signal line disposed on the substrate and overlapped with the first electrode and the second electrode; and a second signal line disposed on the substrate and adjacent to the first signal line, wherein the first signal line and the second signal line extend along a first direction and are separated from each other, wherein a distance between the first via hole and the second via hole along the first direction is greater than a distance between the first signal line and the second signal line along a second direction different the first direction.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Embodiment 1

Figure 1:
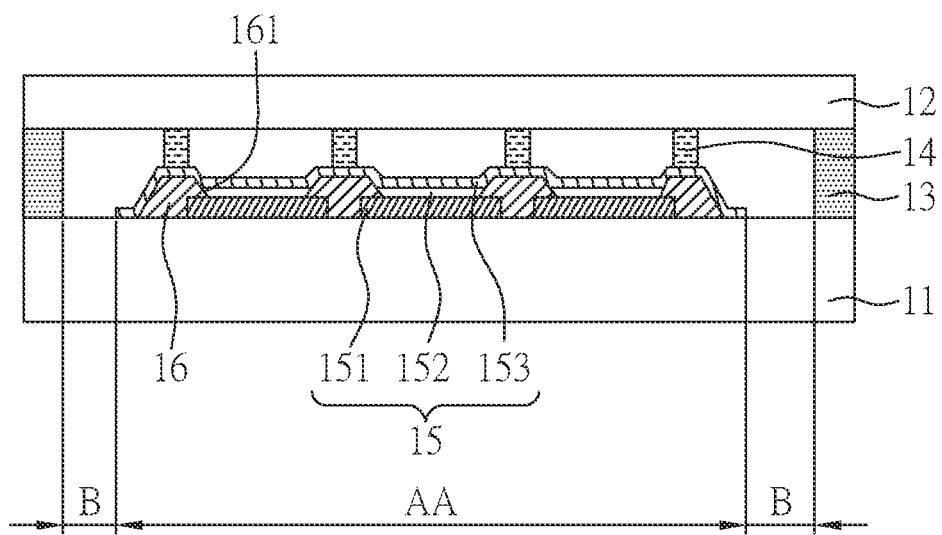
FIG. 1 is a cross sectional view of an OLED display device according to Embodiment 1 of the present disclosure.

FIG. 1 is a cross sectional view of an OLED display device of the present embodiment. In the process for preparing the OLED display device, a first substrate 11 and a second substrate 12 are provided. Organic light emitting diodes 15 and pixel defining layer 16 are disposed on the first substrate 11, wherein a part of the pixel defining layer 16 is disposed between two adjacent organic light emitting diodes 15. In addition, the display device may further comprise at least a spacer 14 disposed on the pixel defining layer. In this embodiment, plural spacers 14 are disposed between the first substrate 11 and the second substrate 12. In this embodiment, a glue material 13 (in the present embodiment, a frit) is disposed adjacent to edges of the second substrate 12 in advance, which is adhered onto the second substrate 12 through a dispensing process and an annealing process. Next, the first substrate 11 and the second substrate 12 are assembled, wherein the spacers 14 are disposed correspondingly to parts of the pixel defining layer 16 without pixel openings 161. After a laser annealing process, the glue material 13 is adhered between the first substrate 11 and the second substrate 12, and the OLED display device of the present embodiment is obtained.

In the present embodiment, the first substrate 11 and the second substrate 12 can be a glass substrate, a plastic substrate, or other flexible substrate or film, such us polyimide, but other embodiments of the present disclosure are not limited thereto. When the first substrate 11 and the second substrate 12 are flexible substrates or films, the OLED display device is a flexible OLED display device. Furthermore, in some embodiment of the present disclosure, the OLED display device is not equipped with the second substrate 12.

In addition, as shown in FIG. 1, the OLED display device of the present embodiment comprises a display region AA and a border region B, wherein the border region B is a region with circuits formed thereon, and the display region AA is a region with organic light emitting diodes 15 and transistors (not shown in the figure) formed thereon. Furthermore, in the present embodiment, the organic light emitting diodes 15 can respectively emit red, green or blue light, but other embodiments of the present disclosure are not limited thereto. For example, the organic light emitting diodes 15 can be white organic light emitting diodes; and in this case, one of the first substrate 11 and the second substrate 12 is disposed with a color filter layer (not shown in the figure).

In addition, as shown in FIG. 1, in the OLED display device of the present embodiment, the organic light emitting diode 15 comprises: a first electrode 151, a light emitting layer 152 and a second electrode 153 sequentially disposed on the first substrate 11. The first electrode 151 electrically connects to a transistor (not shown in the figure) disposed on the first substrate 11. The pixel defining layer 16 is disposed on a part of the first electrode 151, and a light emitting region is defined by the pixel opening 161 of the pixel defining layer 16. Herein, the organic light emitting diode 15 containing only the first electrode 151, the light emitting layer 152 and the second electrode 153 is exemplified, but the present disclosure is not limited thereto. Other elements capable of using in the organic light emitting diode can also be used in the organic light emitting diode of the present disclosure. For example, the elements such as an electron transporting layer, an electron injection layer, a hole transporting layer, a hole injection layer, and other layers capable of facilitating the transporting or combination of the holes and the electrons can also be used in the organic light emitting diode of the present disclosure.

Hereinafter, the structure of the pixel units on the display region AA of the first substrate in the OLED display device of the present embodiment and a manufacturing process thereof are illustrated in detail.

Figure 2:
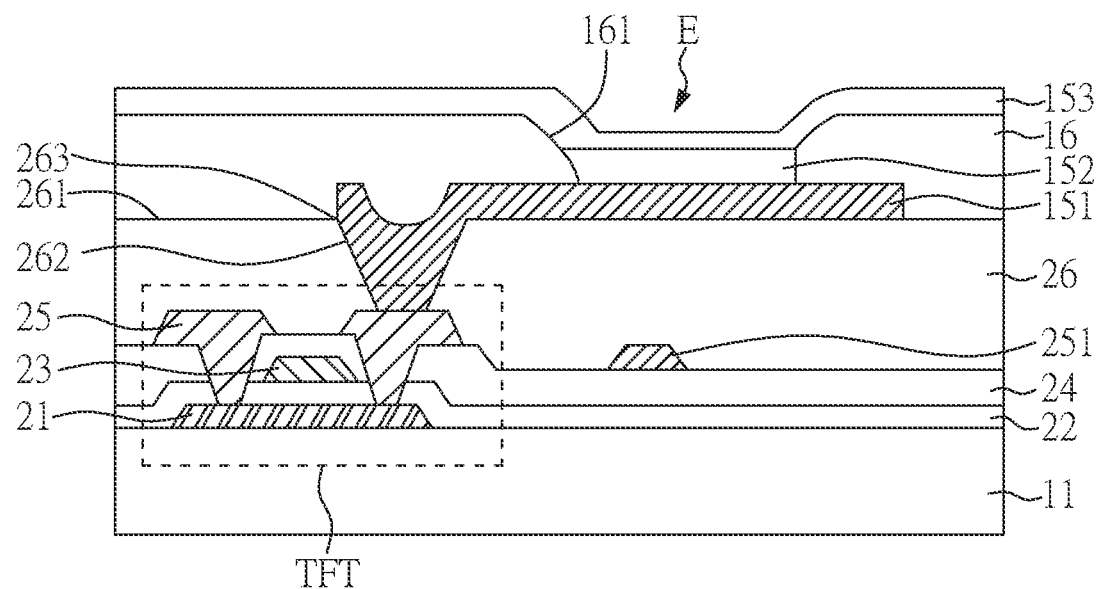
FIG. 2 is a cross sectional view of a display region of an OLED display device according to Embodiment 1 of the present disclosure.

FIG. 2 is a cross sectional view of a display region of the OLED display device of the present embodiment. In the display device of the present embodiment, a transistor TFT is disposed on the first substrate 11, and the manufacturing process of the transistor TFT are briefly described below. First, a first substrate 11 is provided. A semiconductor layer 21 is formed on the first substrate 11, wherein the semiconductor layer 21 is a polysilicon layer formed by amorphous silicon after laser annealing. However, other embodiments of the present disclosure are not limited thereto. Next, a gate insulating layer 22, a first metal layer 23 and a second insulating layer 24 are sequentially formed on the first substrate 11. The first metal layer 23 is used as a gate electrode. The gate insulating layer 22 and the second insulating layer 24 can be prepared by any insulting material such as silicon oxide or silicon nitride. However, other embodiments of the present disclosure are not limited thereto. Then, a second metal layer 25 is formed on the second insulating layer 24. Herein, the second metal layer 25 of the transistor TFT further penetrates through the second insulating layer 24 and used as a source electrode and a drain electrode. Part of the second metal layer 25 locating outside the transistor TFT further comprises a data line 251.

Herein, the transistor TFT on the first substrate 11 is a low temperature polysilicon thin film transistor. However, in other embodiment of the present disclosure, the aspect and the structure of the thin film transistor is not limited to the transistor TFT shown in FIG. 2. In addition, in other embodiment of the present disclosure, the components of the transistor are not limited to the layers shown in FIG. 2, and may comprise other layers such as a buffer layer or another insulating layer to facilitate the adhesion between layers and the electric property of the transistor. In other embodiment of the present disclosure, the transistor can be a bottom gate transistor, wherein a first metal layer 23 is formed on the first substrate 11, followed by disposing the gate insulating layer 22 and the semiconductor layer 21, and then disposing other layers.

After forming the second metal layer 25, a first insulating layer 26, a first electrode layer 151, a pixel defining layer 16, an organic layer 152 and a second electrode layer 153 are sequentially formed on the first substrate 11, and the organic light emitting diode 15 of the present embodiment is obtained. Herein, the first insulating layer 26 can be prepared by any material for a planer layer, but the present disclosure is not limited thereto. The pixel defining layer 16 can be prepared by any insulating material such as a resin, and the pixel opening 161 for defining the light emitting region E is formed by a patterning process. The first electrode layer 151 can be a reflective electrode, a transparent electrode or a semi-transparent electrode. In the present embodiment, the first electrode layer 151 is the reflective electrode. The second electrode layer 153 can be a transparent electrode or a semi-transparent electrode.

Herein, the reflective electrode can be, for example, an electrode prepared by Ag, Ge, Al, Cu, Mo, Ti, Sn, AlNd, ACX, APC and so on. The transparent electrode can be a transparent conductive oxide electrode, such as an ITO electrode, an IZO electrode or an ITZO electrode. The semi-transparent electrode can be a metal thin film electrode, for example, an Mg/Ag alloy thin film electrode, an Au thin film electrode, a Pt thin film electrode, or an Al thin film electrode. In addition, if it is necessary, the second electrode layer 153 of the present embodiment can be a composite electrode containing a transparent electrode and a semi-transparent electrode, for example, a composite electrode of a TCO electrode and a Pt thin film electrode. It should be noted that the material of the first electrode layer 151 and the second electrode layer 153 are not limited thereto in other embodiment of the present disclosure.

In the present disclosure, the aforementioned layers can be prepared by any patterning process to form a specific pattern containing an opening.

Figure 3:
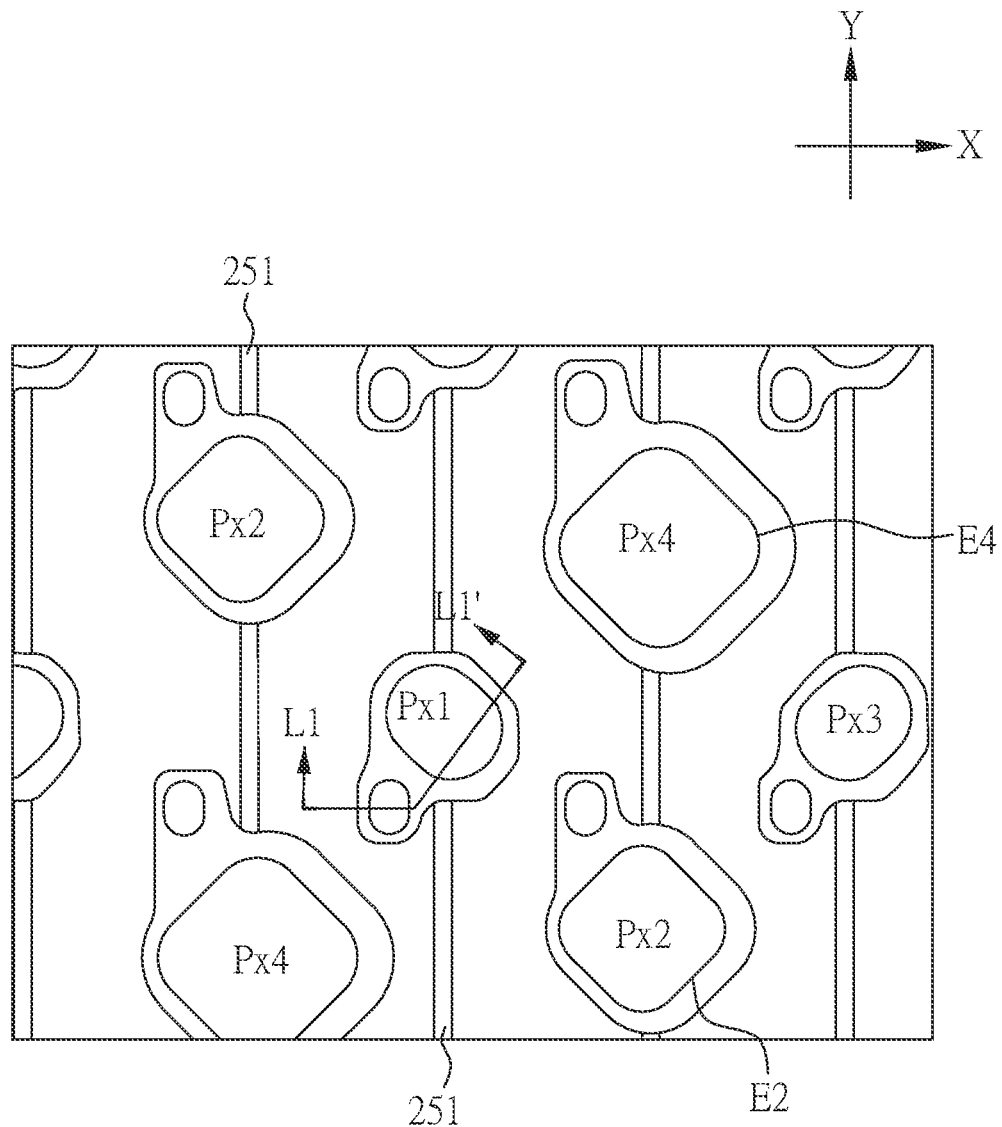
FIG. 3 is a top view showing a part of a display region of an OLED display device according to Embodiment 1 of the present disclosure.
Figure 4:
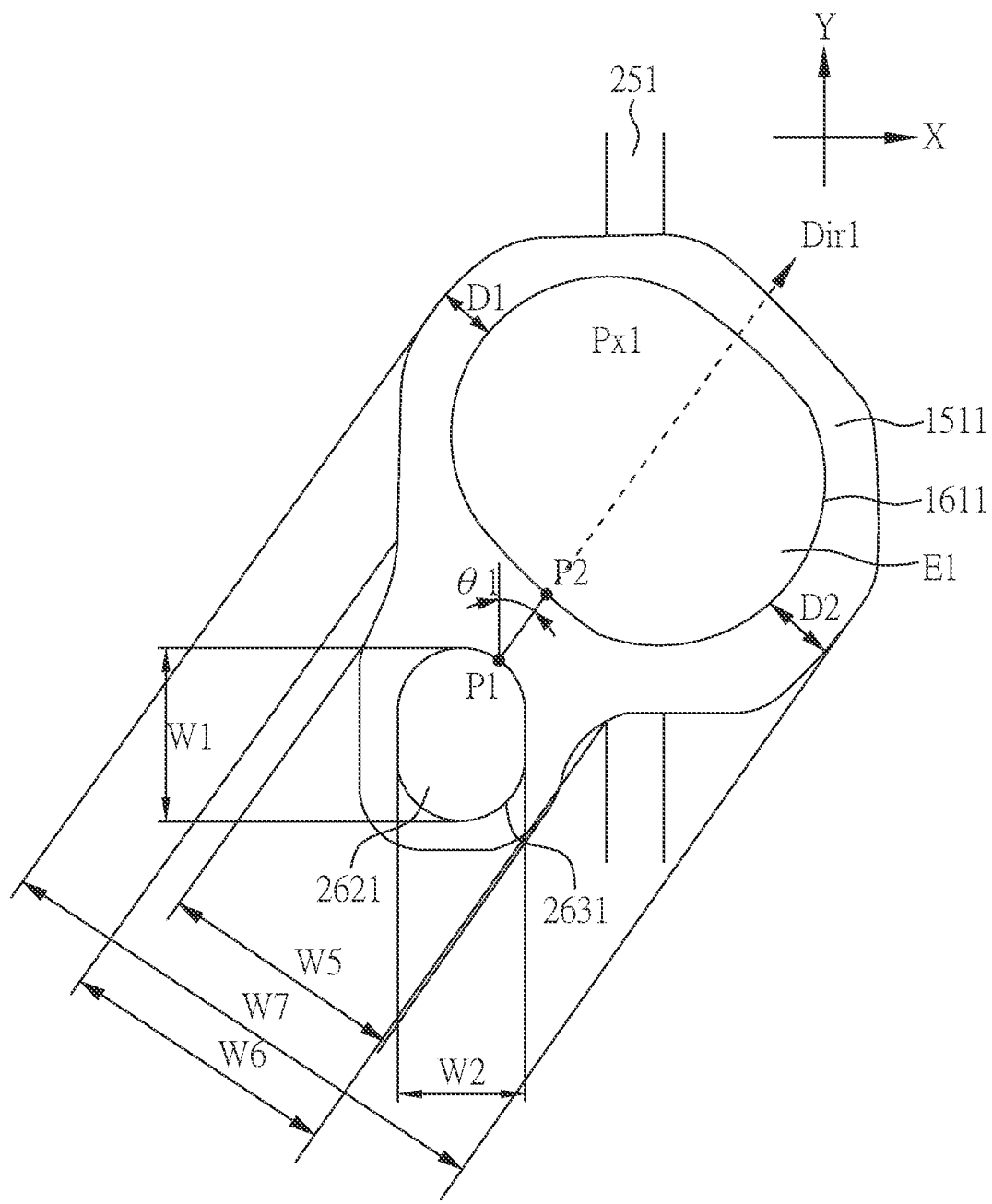
FIG. 4 is an enlarge view of a region comprising a first pixel unit shown in FIG. 3.

FIG. 3 is a top view showing a part of a display region of an OLED display device of the present embodiment, wherein FIG. 2 is a cross sectional view of FIG. 3 according to the line L1-L1', and FIG. 3 is a normal direction view of the first substrate shown in FIG. 2. As shown in FIG. 3, the display device of the present embodiment comprises plural pixel units, for example: a first pixel unit Px1, a second pixel unit Px2, a third pixel unit Px3 and a fourth pixel unit Px4. FIG. 4 is an enlarge view of a region comprising a first pixel unit Px1 shown in FIG. 3. As shown in FIG. 2 to FIG. 4, the display device of the present embodiment comprises: a first substrate 11; a data line 251 disposed on the first substrate 11 and extending along a data-line-extension direction Y; and plural pixel units (including a first pixel unit Px1, a second pixel unit Px2, a third pixel unit Px3 and a fourth pixel unit Px4) disposed on the first substrate 11. Each of the plural pixel units comprise: a transistor TFT disposed on the first substrate 11, wherein the transistor TFT comprises a first metal layer 23, a semiconductor layer 21 and a second metal layer 25, the second metal layer 25 is disposed on the semiconductor layer 21, and the first metal layer 23 corresponds to the semiconductor layer 21; a first insulating layer 26 disposed on the transistor TFT, wherein the first insulating layer 26 comprises an upper surface 261, at least a via hole 262 passing through the first insulating layer 26; a first electrode 151 disposed on the upper surface 261 of the first insulating layer 26, wherein the first electrode 151 electrically connects to the second metal layer 25 through the via hole 262 (more specifically, parts of the first electrode 151 extends into the via hole 262 and electrically connects to the second metal layer 25); a pixel defining layer 16 disposed on the first electrode 151 and the first insulating layer 26, wherein the pixel defining layer 16 exposes a part of the first electrode 151 to define a light emitting region E; a light emitting layer 152 disposed on the first electrode 151 and in the light emitting region E; and a second electrode 153 disposed on the light emitting layer 152.

As shown in FIG. 3, in the display device of the present embodiment, one of the pixel units is a first pixel unit Px1. As shown in FIG. 2 and FIG. 4, in the first pixel unit Px1, the via hole 2621 (which is equal to the via hole 262 shown in FIG. 2) has a first outline 2631 on the upper surface 261 of the first insulating layer 26, and the light emitting region E1 (which is equal to the light emitting region E shown in FIG. 2) has a second outline 1611 on an upper surface of the first electrode 1511 (which is equal to the first electrode 151 shown in FIG. 2, and the second outline 1611 on an upper surface of the first electrode 1511 is equal to that on the upper surface 261 of the first insulating layer 26). Herein, in the normal direction view of the first substrate 11, the first outline 2631 has a first point P1, the second outline 1611 has a second point P2, a minimum distance between the first outline 2631 and the second outline 1611 is a distance between the first point P1 and the second point P2, a first extension direction Dir1 is an extending direction of a connecting line between the first point P1 and the second point P2, and the first extension direction Dir1 is not perpendicular and not parallel to the data-line-extension direction Y. In another embodiment of the present disclosure, an acute angle θ1 is included between the data-line-extension direction Y and the first extension direction Dir1 defined by the extending direction of the connecting line between the first point P1 and the second point P2, and the acute angle θ1 is greater than or equal to 10 degrees and less than or equal to 80 degrees. Herein, the acute angle θ1 is measured by the acute angle included by the first extension direction Dir1 and the data-line-extension direction Y. It should be noted that the data line can be a linear line, a curved line or a line with a bending potion, and any data lines are fallen into the scope of the present disclosure as long as the data line has a substantial data-line-extension direction Y. In the display device of the present embodiment, when the first extension direction Dir1 defined by the connecting line with the minimum distance between the first outline 2631 of the via hole 2621 (which is equal to the via hole 262 shown in FIG. 2) on the upper surface 261 of the first insulating layer 26 and the second outline 1611 of the light emitting region E1 (which is equal to the light emitting region E shown in FIG. 2) in the normal view of the first substrate 11 is different from the data-line-extension direction Y, and an acute angle is formed between the first extension direction Dir1 and the data-line-extension direction Y, the connecting line between the via hole 2621 and the light emitting region E1 is not aligned with the data line 251. When the connecting line between the via hole 2621 and the light emitting region E1 is designed to be not aligned with the data line 251, the distance between the light emitting region E1 and the data line 251 can be maintained; therefore, the manufacture yield of the display device can be improved.

More specifically, when the connecting line with the minimum distance between the via hole 2621 and the light emitting region E1 is disposed to be perpendicular to the data-line-extension direction Y, which means the first extension direction Dir1 defined by the connecting line with the minimum distance between the first outline 2631 of the via hole 2621 (which is equal to the via hole 262 shown in FIG. 2) on the upper surface 261 of the first insulating layer 26 and the second outline 1611 of the light emitting region E1 (which is equal to the light emitting region E shown in FIG. 2) is substantially perpendicular to the data-line-extension direction Y, color mix between adjacent pixel units may be occurred if the gap between the via hole 2621 (which is equal to the via hole 262 shown in FIG. 2) and the light emitting region E1 is maintained; and therefore, the manufacture yield of the display device is reduced. In addition, in the aforementioned situation, the mask for forming the light emitting layer 152 has to be finer and more delicate. It could influence the overall light emitting efficiency of the OLED device. When the connecting line between the via hole 2621 and the light emitting region E1 is disposed to be parallel to the data-line-extension direction Y, which means the first extension direction Dir1 defined by the extending direction of the connecting line with the minimum distance between the first outline 2631 of the via hole 2621 (which is equal to the via hole 262 shown in FIG. 2) and the second outline 1611 of the light emitting region E1 (which is equal to the light emitting region E shown in FIG. 2) is substantially parallel to the data-line-extension direction Y, the region that the first electrode can be exposed therefrom is reduced if the arrangement of the via hole 2621 (which is equal to the via hole 262 shown in FIG. 2) in the display region is maintained; which means the area of the light emitting region E1 is reduced, resulting in the overall light emitting efficiency is reduced. However, if the gap between the light emitting regions E1 (which is equal to the light emitting region E shown in FIG. 2) and the via hole 2621 is increased to prevent the aforementioned situation, the numbers of the pixel units disposed in the display region is reduced. Hence, in the display device of the present disclosure, when the connecting line with the minimum distance between the via hole 2621 and the light emitting regions E1 is not aligned with the data line 251 which means that the light emitting regions E1 is not aligned with the via hole 2621, the manufacture yield of the display device can be improved without reducing the number of the pixel units in a limited display region.

In addition, as shown in FIG. 4, in the present embodiment, in the normal direction view of the first substrate, the first outline 2631 has an arc edge. In particular, the first outline 2631 has an ellipse like shape. Herein, a maximum width of the first outline 2631 in the data-line-extension direction Y is defined as a first maximum width W1, a maximum width of the first outline 2631 in a direction X perpendicular to the data-line-extension direction Y is defined as a second maximum width W2, and the first maximum width W1 is different from the second maximum width W2. In another embodiment, the first maximum width W1 is greater than the second maximum width W2; in this case, a direction of the long axis of the ellipse like shape of the first outline 2631 is approximately parallel to the data-line-extension direction Y. If the first maximum width W1 is less than the second maximum width W2, the direction of the long axis of the ellipse like shape of the first outline 2631 is approximately perpendicular to the data-line-extension direction Y, resulting in the edge of the first outline 2631 is too close to the data line 251 (please refer to FIG. 3). If there is a mismatch occurred in the lithography process for forming the via hole 2621, a short circuit may be easily occurred.

Figure 5:
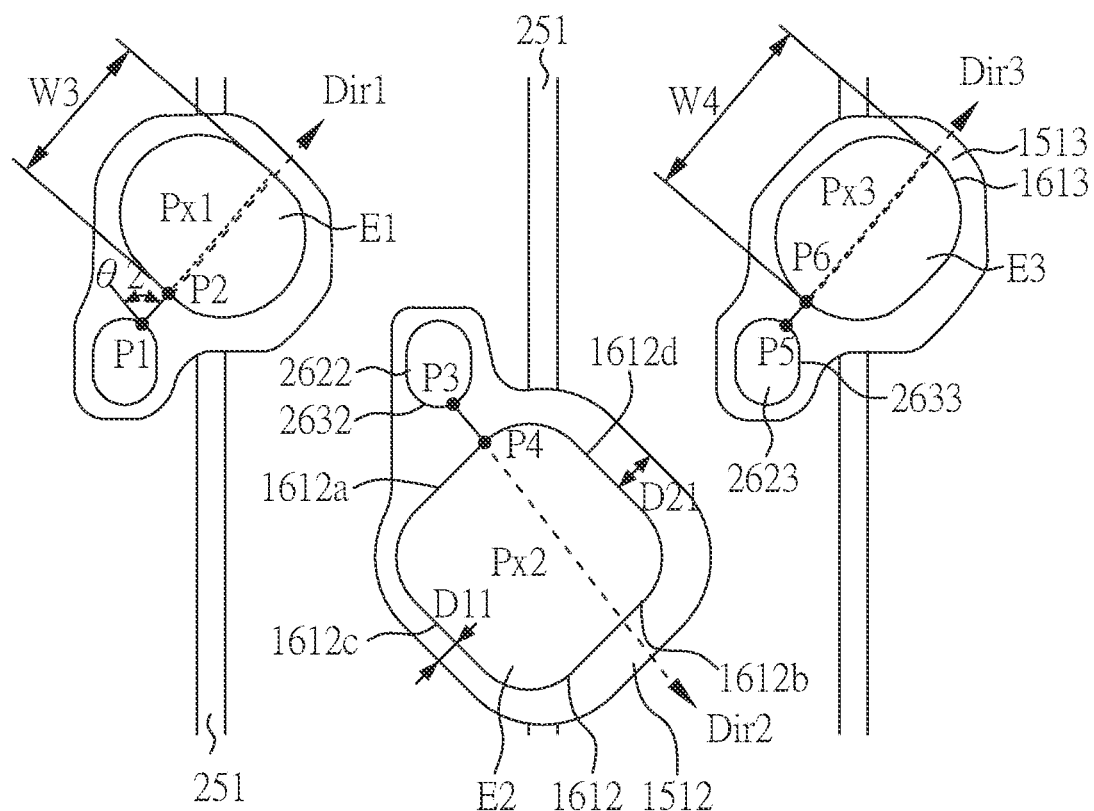
FIG. 5 is an enlarge view of a region comprising a first pixel unit, a second pixel unit and a third pixel unit shown in FIG. 3.

FIG. 5 is an enlarge view of a region comprising a first pixel unit Px1, a second pixel unit Px2 and a third pixel unit Px3 shown in FIG. 3. As shown in FIG. 2 and FIG. 5, in the display device of the present embodiment, the second pixel unit Px2 of the plural pixel units which is adjacent to the first pixel unit Px1, and is the closest pixel unit near to the first pixel unit Px1. In the second pixel unit Px2, the via hole 2622 (which is equal to the via hole 262 shown in FIG. 2) has a third outline 2632 on the upper surface 261 of the first insulating layer 26, and the light emitting region E2 (which is equal to the light emitting region E shown in FIG. 2) has a fourth outline 1612 on the upper surface 261 of the first insulating layer 26; wherein, the third outline 2632 has a third point P3, the fourth outline 1612 has a fourth point P4, a minimum distance between the third outline 2632 and the fourth outline 1612 is a distance between the third point P3 and the fourth point P4 in the normal direction view of the first substrate 11, a second extension direction Dir2 is an extending direction of the connecting line between the third point P3 and the fourth point P4, and the second extension direction Dir2 is different from the first extension direction Dir1 defined by the extending direction of the connecting line between the first point P1 and the second point P2. In another embodiment of the present disclosure, an angle θ2 included between the first extension direction Dir1 and the second extension direction Dir2 is greater than or equal to 60 degrees and less than or equal to 120 degrees.

As shown in FIG. 2, FIG. 3 and FIG. 5, in the pixel units of the display device of the present embodiment, the pixel units are arranged along the data-line-extension direction Y or/and a direction X perpendicular to the data-line-extension direction Y. The pixel units further comprise a third pixel unit Px3, which is adjacent to the first pixel unit Px1 and locates in the direction X (It means a connection line between a center of the first pixel unit Px1 and a center of the third pixel unit Px3 is substantially along the direction X). In the third pixel unit Px3, the via hole 2623 (which is equal to the via hole 262 shown in FIG. 2) has a fifth outline 2633 on the upper surface 261 of the first insulating layer 26, and the light emitting region E3 (which is equal to the light emitting region E shown in FIG. 2) has a sixth outline 1613 on the upper surface 261 of the first insulating layer 26. The fifth outline 2633 has a fifth point P5, the sixth outline 1613 has a sixth point P6, a minimum distance between the fifth outline 2633 and the sixth outline 1613 is a distance between the fifth point P5 and the sixth point P6 in the normal direction view of the first substrate 11, and a third extension direction Dir3 is an extending direction of a connecting line between the fifth point P5 and the sixth point P6. Therein, a maximum width of the light emitting region E1 of the first pixel unit Px1 (the second outline 1611) in the first extension direction Dir1 (defined by an extending direction of the connecting line with the minimum distance of the first point P1 and the second point P2) is defined as a third maximum width W3, a maximum width of the light emitting region E3 of the third pixel unit Px3 (the sixth outline 1613) in the third extension direction Dir3 (defined by an extending direction of the connecting line with the minimum distance of the point P5 and the point P6) is defined as a fourth maximum width W4, and the third maximum width W3 is different from the fourth maximum width W4.

In addition, in the present embodiment, the third pixel unit Px3 and the first pixel Px1 unit substantially have the same color; but the present disclosure is not limited thereto.

Furthermore, as shown in FIG. 3 and FIG. 5, in the present embodiment, the light emitting region E1 of the first pixel unit Px1 has an ellipse like shape in the normal direction view of the first substrate 11, and the first electrode 151 of the first pixel unit Px1 overlaps the data line 251. The pixel units further comprise a second pixel unit Px2 and a fourth pixel unit Px4, and an area of the light emitting region E2 of the second pixel unit Px2 is less than an area of the light emitting region E4 of the fourth pixel unit Px4. The second pixel unit Px2 and the fourth pixel unit Px4 respectively locate at two sides of the first pixel unit Px1 or the data line 251 (in other words, the data line 251 is located between the second pixel unit Px2 and the fourth pixel unit Px4), the second pixel unit Px2 and the fourth pixel unit Px4 are arranged in the same row or the same column (it means a connection line between a center of the second pixel unit Px2 and a center of the fourth pixel unit Px4 is sunstantially along the data-extension-direction or perpendicular to the data-extension-direction), the first pixel unit Px1 and the second pixel unit Px2 are not arranged in the same row or the same column, and the first pixel unit Px1 and the fourth pixel unit Px4 are not arranged in the same row or the same column. Herein, "one pixel unit and another pixel unit are (not) arranged in the same row or the same column" refers to that a connection line between a center of one pixel unit and a center of another pixel unit is (not) along the data-extension-direction or (not) perpendicular to the data-extension-direction. The second pixel unit Px2 is adjacent to the first pixel unit Px1, and an extension line of a long axis of the light emitting region E1 of the first pixel unit Px1 overlaps with the second pixel unit Px2; wherein the fourth pixel unit Px4 is adjacent to the first pixel unit Px1, and an extension line of a short axis of the light emitting region E1 of the first pixel unit Px1 overlaps with the fourth pixel unit Px4.

As shown in FIG. 5, in the present embodiment, even though both the light emitting region E1 of the first pixel unit Px1 and the light emitting region E3 of the third pixel unit Px3 have ellipse like shapes, the direction of the long axis of the light emitting region E1 and a direction of the long axis of the light emitting region E3 are different. In particular, when the direction of the long axis of the light emitting region E1 of the first pixel unit Px1 is different from the direction of the long axis of the light emitting region E3 of the third pixel unit Px3 (in particular, the directions of the long axes of the light emitting region E1 of the first pixel unit Px1 and the light emitting region E3 of the third pixel unit Px3 are directed to the second pixel unit Px2 with a smaller light emitting region than the fourth pixel unit Px4), the brightness of the second pixel unit Px2 can be compensated. Therefore, the overall brightness of the display device can further be more even.

In the present embodiment, both the light emitting region E1 of the first pixel unit Px1 and the light emitting region E3 of the third pixel unit Px3 have ellipse like shapes, but the present disclosure is not limited thereto. The light emitting region E1 of the first pixel unit Px1 and the light emitting region E3 of the third pixel unit Px3 may have a rectangle like shape, as long as the direction of the long axis of the light emitting region E1 and a direction of the long axis of the light emitting region E3 are different, and the second pixel unit Px2 with smaller area is overlapped with an extension line of the long axis of the rectangle like shape.

In addition, as shown in FIG. 4, in the first pixel unit Px1, in a direction perpendicular to the first extension direction Dir1, a first gap D1 and a second gap D2 are between the second outline 1611 of the light emitting region E1 and an adjacent edge of the first electrode 1511, and the first gap D1 is different from the second gap D2.

Furthermore, as shown in FIG. 5, in second pixel unit Px2, in a direction perpendicular to the second extension direction Dir2, a first gap D11 and a second gap D21 are also between the second outline 1612 of the light emitting region E2 and an adjacent edge of the first electrode 1512, and the first gap D11 is different from the second gap D21. Herein, the light emitting region of the second pixel unit Px2 has a rectangle like shape, and has a first edge 1612a adjacent to the via hole 2622, a second edge 1612b opposite to the first edge 1612a, and a third edge 1612c and a fourth edge 1612d between the first edge 1612a and the second edge 1612b. The first gap D11 is the distance between the third edge 1612c and the adjacent edge of the first electrode 1512, and the second gap D21 is the distance between the fourth edge 1612d and the adjacent edge of the first electrode 1512.

In addition, as shown in FIG. 4, in a direction perpendicular to the first extension direction Dir1, the first electrode 1511 of the first pixel unit Px1 corresponding to the first outline 2631 has a fifth width W5, the first electrode 1511 has a sixth width W6 between the first outline 2631 and the second outline 1611, and the sixth width W6 is greater than the fifth width W5. In this case, the width of the first electrode 1511 is gradually increased from the first outline 2631 to the second outline 1611. Thus, the heat generated at the first electrode 1511 between the first outline 2631 and the second outline 1611 can be decreased. In another embodiment of the present disclosure, the first electrode 1511 of the first pixel unit Px1 corresponding to the second outline 1611 has a seventh width W7 in the direction perpendicular to the first extension direction Dir1, and the seventh width W7 is greater than the sixth width W6.

Embodiments 2 and 3

Figure 6:
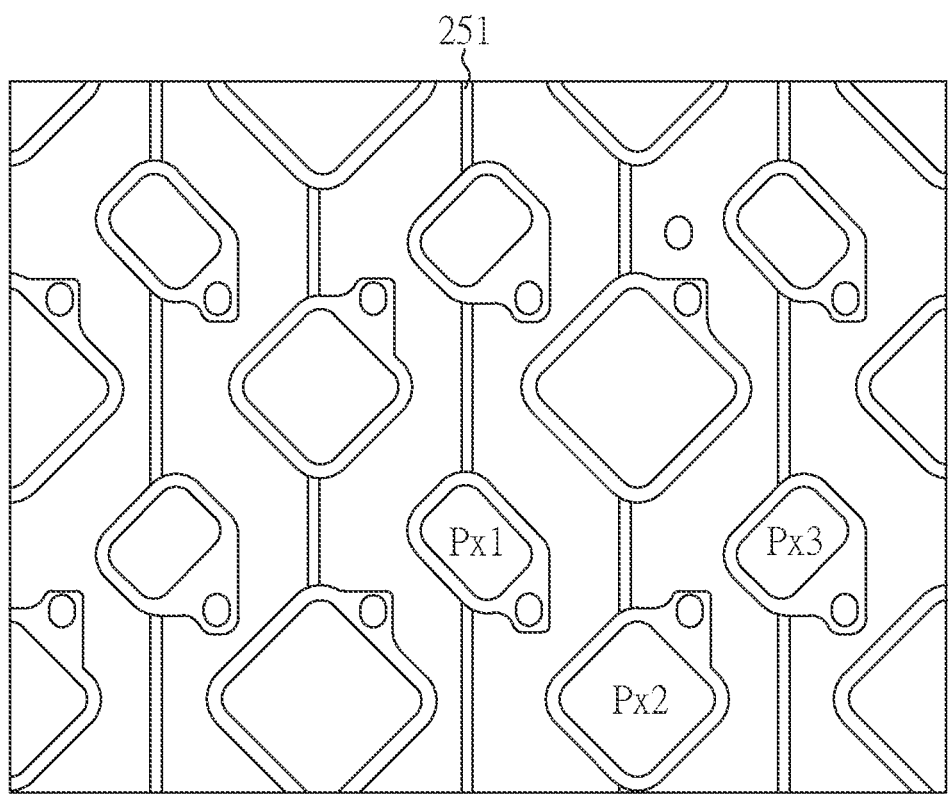
FIG. 6 is a top view showing a part of a display region of an OLED display device according to Embodiment 2 of the present disclosure.
Figure 7:
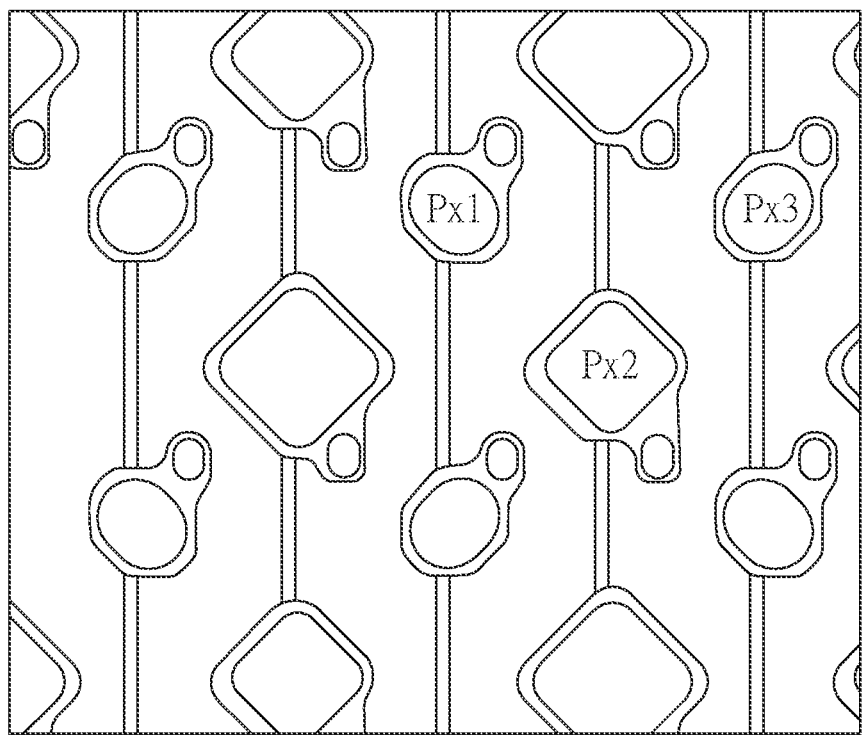
FIG. 7 is a top view showing a part of a display region of an OLED display device according to Embodiment 3 of the present disclosure.

FIG. 6 and FIG. 7 are respectively top views showing a part of a display region of an OLED display device of Embodiments 2 and 3, wherein FIG. 6 and FIG. 7 are respectively a normal direction view of the first substrate shown in FIG. 2. Herein, the structure of the OLED display devices of Embodiments 2 and 3 are similar to that of Embodiment 1, except the shapes and the positions of the first electrode, the light emitting regions and the via holes.

A display device made as described in any of the embodiments of the present disclosure as described previously may be integrated with a touch panel to form a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:
1. A display device, comprising:
a first substrate;
a data line disposed on the first substrate and extending along a data-line-extension direction; and
three pixel units disposed on the first substrate, each of the three pixel units comprising:
  a transistor disposed on the first substrate;
  a first insulating layer disposed on the transistor, wherein the first insulating layer comprises an upper surface, and at least a via hole passing through the first insulating layer;
  a first electrode disposed on the first insulating layer, wherein the first electrode electrically connects to the transistor through the via hole;
  a pixel defining layer disposed on the first electrode and the first insulating layer, wherein the pixel defining layer exposes a part of the first electrode to define a light emitting region;
  a light emitting layer disposed on the first electrode; and
  a second electrode disposed on the light emitting layer;
wherein, in each of the three pixel units, the via hole has a first outline on the upper surface of the first insulating layer, and the light emitting region has a second outline on the upper surface of the first insulating layer; and
wherein the first outline has a first point, the second outline has a second point, a minimum distance between the first outline and the second outline is a distance between the first point and the second point, a first extension direction is an extending direction of a connecting line between the first point and the second point in that pixel unit,
wherein, in a normal direction view of the first substrate, at least one pixel unit of the three pixel units partially overlaps the data line, wherein, in at least two pixel units of the three pixel units, each second outline has a long axis and a short axis, the directions of the long axis being different for each of the at least two pixel units, further wherein each of the at least two pixel units emits the same color, and wherein, in a normal direction view of the first substrate, a width of the first electrode continuously increases between the first point and the second point in each of the two pixel units.

2. The display device according to claim 1, wherein at least one of the at least two pixel units has an ellipse shape.

3. The display device according to claim 2, wherein in one of the three pixel units, in a direction perpendicular to the first extension direction, a first gap and a second gap are between the second outline of the light emitting region and an adjacent edge of the first electrode, and the first gap is different from the second gap.

4. The display device according to claim 2, wherein in one of the at least two pixel units, in a direction perpendicular to the first extension direction, a first gap and a second gap are between the second outline of the light emitting region and an adjacent edge of the first electrode, and the first gap is different from the second gap.

5. The display device according to claim 2, wherein in both of the at least two pixel units, in a direction perpendicular to the first extension direction, a first gap and a second gap are between the second outline of the light emitting region and an adjacent edge of the first electrode, and the first gap is different from the second gap.

6. The display device according to claim 2, wherein in all of the three pixel units, in a direction perpendicular to the first extension direction, a first gap and a second gap are between the second outline of the light emitting region and an adjacent edge of the first electrode, and the first gap is different from the second gap.

7. The display device according to claim 1, wherein at least one of the at least two pixel units has a rectangular shape.

8. The display device according to claim 7, wherein in one of the three pixel units, in a direction perpendicular to the first extension direction, a first gap and a second gap are between the second outline of the light emitting region and an adjacent edge of the first electrode, and the first gap is different from the second gap.

9. The display device according to claim 7, wherein in one of the at least two pixel units, in a direction perpendicular to the first extension direction, a first gap and a second gap are between the second outline of the light emitting region and an adjacent edge of the first electrode, and the first gap is different from the second gap.

10. The display device according to claim 7, wherein in both of the at least two pixel units, in a direction perpendicular to the first extension direction, a first gap and a second gap are between the second outline of the light emitting region and an adjacent edge of the first electrode, and the first gap is different from the second gap.

11. The display device according to claim 7, wherein in all of the three pixel units, in a direction perpendicular to the first extension direction, a first gap and a second gap are between the second outline of the light emitting region and an adjacent edge of the first electrode, and the first gap is different from the second gap.

* * * * *